United States Patent
Besser et al.

(12)

(10) Patent No.: US 6,372,673 B1
(45) Date of Patent: Apr. 16, 2002

(54) SILICON-STARVED NITRIDE SPACER DEPOSITION

(75) Inventors: Paul R. Besser, Austin, TX (US); Minh Van Ngo, Fremont, CA (US); Christy Mei-Chu Woo, Cupertino, CA (US); George Jonathan Kluth, Los Gatos, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/781,256

(22) Filed: Feb. 13, 2001

(51) Int. Cl.[7] ............................................. H01L 21/318
(52) U.S. Cl. ...................... 438/792; 438/303; 438/683
(58) Field of Search ................................ 438/792, 683, 438/656, 303, 595

(56) References Cited

U.S. PATENT DOCUMENTS

| | | | | |
|---|---|---|---|---|
| 5,399,387 A | * | 3/1995 | Law et al. | 427/574 |
| 5,525,529 A | * | 6/1996 | Guldi | 437/28 |
| 6,121,138 A | * | 9/2000 | Wieczorek et al. | 438/682 |
| 6,140,255 A | * | 10/2000 | Ngo et al. | 438/791 |
| 6,242,367 B1 | * | 6/2001 | Sun et al. | 438/792 |
| 6,258,648 B1 | * | 7/2001 | Lee | 438/238 |
| 6,297,173 B1 | * | 10/2001 | Tobin et al. | 438/778 |
| 6,319,568 B1 | * | 11/2001 | Dai et al. | 427/579 |

* cited by examiner

*Primary Examiner*—Charles Bowers
*Assistant Examiner*—Stephen W. Smoot

(57) ABSTRACT

Bridging between a metal silicide e.g., nickel silicide, layer on a gate electrode and metal silicide layers on associated source/drain regions is avoided by forming silicon-starved silicon nitride sidewall spacers having substantially no or significantly reduced Si available for reaction with deposited metal, e.g., nickel.

19 Claims, 2 Drawing Sheets

SILICON-STARVED NITRIDE SPACER DEPOSITION

FIELD OF THE INVENTION

The present invention relates to semiconductor device fabrication, particularly to self-aligned silicide (salicide) technology.

BACKGROUND ART

As gate electrode lengths are scaled down, the source and drain junctions and polycrystalline silicon line width must also be scaled down. However, scaling down the source and drain junctions and polycrystalline line width increases parasitic resistance in the source and drain diffusion layers and the gate electrode, and also increases the sheet and contact resistance of the gate electrode and source/drain regions.

Salicide technology comprises forming metal silicide layers on the source/drain regions and/or on the gate electrode of a semiconductor wafer in a self-aligned manner. A conventional approach to reduce resistivity involves forming a multi-layered structure comprising a low resistance refractory metal silicide layer on a doped polycrystalline silicon, typically referred to as a polycide. Salicide technology reduces parasitic sheet and contact resistance in the source and drain diffusion layers and the gate electrode that results from scaling down the source and drain junctions and polycrystalline silicon line width.

Silicides are typically formed by reacting a metal with silicon (Si) within a specified temperature range for a specific period of time. Silicide layers may be self-aligned by different techniques. For example, the metal can be selectively deposited on the gate electrode and on the source/drain regions, with subsequent annealing to react the metal with underlying Si in the source/drain regions and the gate electrode to form the metal silicide layers. Alternatively, sidewall spacers, e.g., silicon nitride or silicon dioxide, are formed on the side surfaces of the gate electrode, followed by a blanket deposition of metal and annealing to react the metal with Si in the gate electrode and the source/drain regions, while the sidewall spacers prevent metal reaction with Si from the side surfaces of the gate electrode.

During annealing, the wafer is heated to a reaction temperature and held at the reaction temperature for a period of time sufficient for the metal layer to react with underlying Si to form a metal silicide layer on the source/drain regions and the gate electrode. Multiple annealing steps may be employed.

Various metals react with Si to form a metal silicide; however, titanium (Ti) and cobalt (Co) are currently the most common metals used to create metal silicides when manufacturing semiconductor devices utilizing salicide technology. Recently, attention has turned towards nickel (Ni) to form nickel silicide utilizing salicide technology. Nickel silicide avoids many limitations associated with $TiSi_2$ and $CoSi_2$. Unlike Ti where Si diffuses into the metal layer when forming a Ti silicide, Ni, like Co, diffuses into Si, which helps to limit bridging between the metal silicide layer in the gate electrode and the metal silicide layer on the associated source/drain regions. The formation of nickel silicide requires less Si than $TiSi_2$ and $CoSi_2$. Nickel silicide also exhibits almost no line width dependence on sheet resistance. Nickel silicide is normally annealed in a one step process, vis-à-vis a process requiring an anneal, an etch, and a second anneal, as occurs in $TiSi_2$ and $CoSi_2$ saliciding. In addition, nickel silicide exhibits lower film stress, i.e., causes less wafer distortion, than conventional Ti or Co suicides.

Salicide processing efficiency is improved through the use of sidewall spacers. Sidewall spacers allow a blanket layer of metal to be deposited over the wafer surface. Sidewall spacers typically comprise silicon dioxide or silicon nitride, but silicon nitride sidewall spacers are often preferable because silicon nitride is highly conformal and the sidewall spacers can be added and removed as needed throughout the manufacturing process. However, the use of silicon nitride sidewall spacers with salicide technology results in bridging between the metal silicide layer on the gate electrode and the metal silicide layers on associated source/drain regions, particularly when Ni is used.

There is a need for salicide technology that avoids bridging between the metal silicide layer on the gate electrode and the metal silicide layers on the source/drain regions when using silicon nitride sidewall spacers, particularly when forming nickel salicide.

DISCLOSURE OF THE INVENTION

These and other needs are satisfied by embodiments of the present invention, which include a method of manufacturing a semiconductor device without bridging between a metal silicide layer, particularly nickel silicide, on the gate electrode and metal silicide layers, e.g., nickel silicide layers, on the source/drain regions using silicon-starved silicon nitride sidewall spacers. The method comprises supplying silane ($SiH_4$) at a flow rate of approximately 100 sccm to approximately 250 sccm, supplying nitrogen ($N_2$) at a flow rate of approximately 3,000 sccm to approximately 6,000 sccm, supplying ammonia ($NH_3$) at a flow rate of approximately 2,000 sccm to approximately 4,000 sccm, applying radio frequency power of approximately 200 watts to approximately 350 watts, applying a pressure of approximately 1.6 torr to approximately 2.2 torr, and maintaining the temperature at approximately 360° C. to approximately 380° C.

The present invention advantageously limits metal bonding with Si in the silicon nitride sidewall spacers by reducing the availability of free Si in the sidewall spacers. Part of the silicidation process involves forming a metal silicide layer e.g., NiSi, on the polysilicon gate electrode and associated source/drain regions using salicide technology without bridging therebetween. In accordance with embodiments of the present invention, bridging is avoided by forming silicon-starved silicon nitride sidewall spacers, whereby the reduced Si in the silicon nitride sidewall spacers eliminates the free Si available to react with the metal subsequently deposited to form the metal silicide layer.

Other advantages of the present invention will become readily apparent to those skilled in the art from the following detailed description. The embodiments shown and described provide illustration of the best mode contemplated for carrying out the invention. The invention is capable of modifications in various obvious respects, all without departing from the invention. Accordingly, the drawings are to be regarded as illustrative in nature, and not as restrictive.

BRIEF DESCRIPTION OF THE DRAWINGS

Reference is made to the attached drawings, wherein elements having the same reference numeral designations represent like elements throughout.

DETAILED DESCRIPTION OF THE INVENTION

Figure 1:
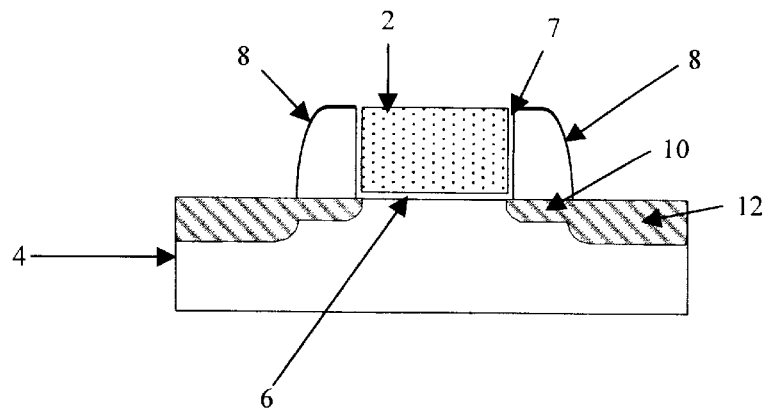
FIGS. 1–3 schematically illustrate sequential phases of a prior art salicide technique resulting in bridging.

The present invention addresses and solves problems related to forming a metal silicide layer on the gate electrode and source/drain regions of a semiconductor wafer. As device geometries shrink into the deep sub-micron regime, metal silicide bridging occurs along the surface of silicon nitride sidewall spacers between the metal silicide layer on the gate electrode and metal silicide layers on associated source/drain regions. For example, adverting to FIG. 1, in attempting to implement nickel silicide technology utilizing silicon nitride sidewall spacers, a gate electrode 2 is formed on silicon substrate 4 with a gate insulating layer 6 therebetween. An oxide liner 7 is disposed as a buffer layer on the side surfaces of the gate electrode 2. A conformal layer of silicon nitride is then deposited followed by anisotropic etching to form silicon nitride sidewall spacers 8 on opposing side surfaces of gate electrode 2. After anisotropic etching, contaminants such as etching residues are removed by wet cleaning. A thin oxide layer, as at a thickness of about 10 Å to about 15 Å, is formed on the exposed surfaces of silicon nitride sidewall spacers 8, on the exposed upper surface of gate electrode 2 and on the exposed surface of substrate 4, acting as a barrier layer preventing nickel silicidation. Sputter etching in argon is then conducted to remove the thin oxide layer from the exposed surfaces of the silicon nitride sidewall spacers 8, from the upper surface of the gate electrode 2 and from the exposed surface of substrate 4. Shallow source/drain extensions 10 and source/drain regions 12 are formed in a conventional manner.

Figure 2:
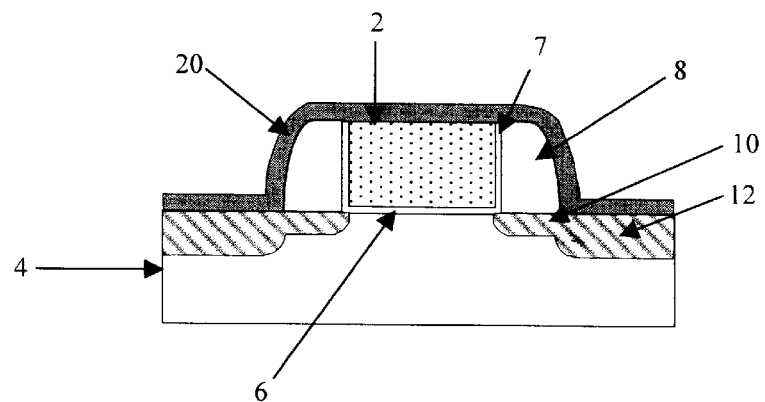

Adverting to FIG. 2, a Ni layer 20 is deposited over the wafer surface. The wafer is then subject to annealing to react Ni with the underlying Si.

Figure 3:
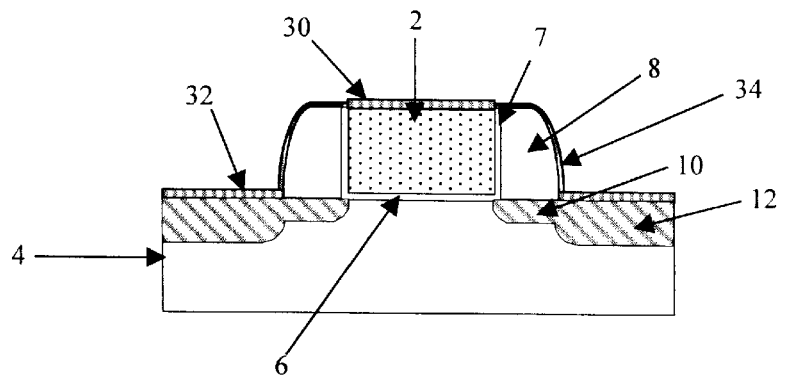
Figure 4:
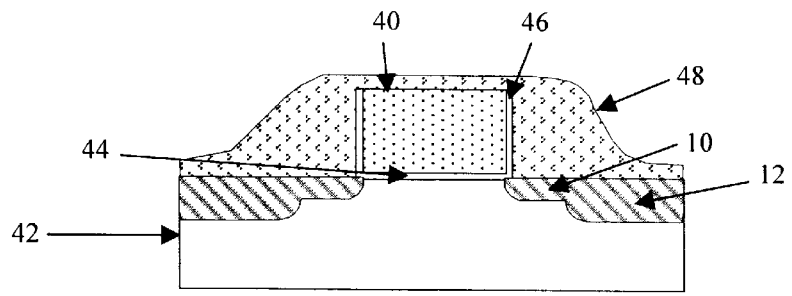
FIGS. 4–7 schematically illustrate sequential phases of a method in accordance with embodiments of the present invention without bridging between the metal silicide layer on the gate electrode and the metal silicide layers on the associated source/drain regions.

As shown in FIG. 3, following heating, a nickel silicide layer 30 is formed on the upper surface of gate electrode 2 and a layer of nickel silicide 32 is formed on associated source/drain regions 12. However, it was found that a thin layer of nickel silicide 34, as at a thickness of about 30 Å to 60 Å, is undesirably formed along the exposed surfaces of silicon nitride sidewall spacers 8 causing bridging and, hence, shorting between nickel silicide layer 30 and nickel silicide layers 32.

After considerable experimentation and investigation, it was postulated that the problem of nickel silicide formation 34 along the silicon nitride sidewall spacers 8 stemmed from the reaction of Ni with dangling Si bonds in the silicon nitride sidewall spacers 8. The present invention addresses and solves such problems by reducing free Si in silicon nitride sidewall spacers 8.

In accordance with embodiments of the present invention, silicon-starved silicon nitride sidewall spacers are formed on the wafer. It was found that decreasing silane flow during spacer formation eliminates free Si leaving substantially no or a significantly reduced amount of Si available for reaction with the deposited metal, e.g., Ni, thereby avoiding metal silicide bridging, such as that denoted by reference numeral 34 in FIG. 3.

An embodiment of the present invention is schematically illustrated in FIGS. 4 through 7, wherein similar reference numerals denote similar features. Adverting to FIG. 4, a gate electrode 40, e.g., doped polycrystalline silicon, is formed on substrate 42, which can be n-type or p-type doped silicon, with a gate insulating layer 44 therebetween. Gate insulating layer 44 is typically silicon dioxide formed by thermal oxidation or chemical vapor deposition (CVD). A spacer oxide liner 46 is disposed on the opposing side surfaces of gate electrode 40 as a buffer between the silicon-starved silicon nitride layer 48 and the side surfaces of the gate electrode 40.

Subsequent to forming spacer oxide liner 46, a silicon-starved silicon nitride layer 48 is deposited to form silicon-starved silicon nitride sidewall spacers. According to an embodiment of the present invention, silicon-starved silicon nitride sidewall spacers are formed by supplying $SiH_4$ at a flow rate of about 100 sccm to about 250 sccm, such as about 150 sccm to about 200 sccm, e.g., about 175 sccm. $N_2$ is supplied at a flow rate of about 3,000 sccm to about 6,000 sccm, or 4,000 sccm to about 5,000 sccm, e.g., at about 4,500 sccm. $NH_3$ is supplied at a flow rate of about 2,000 sccm to about 4,000 sccm, or about 2,500 sccm to about 3,500 sccm, e.g., 3,000 sccm. A radio frequency power supply is applied at about 200 watts to about 350 watts, such as about 250 watts to about 300 watts, e.g., about 275 watts. Pressure is applied at about 1.6 torr to about 2.2 torr, such as about 1.8 torr to about 2.0 torr, e.g., 1.9 torr. The temperature is maintained at about 360° C. to about 380° C., such as about 365° C. to about 375° C., e.g., about 370° C.

Figure 5:
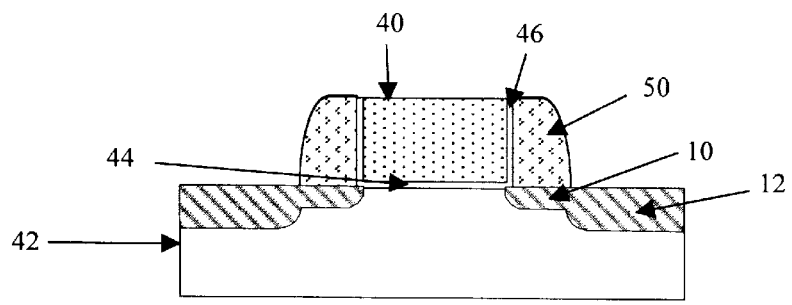

As depicted in FIG. 5, the silicon-starved silicon nitride layer 48 formed in accordance with an embodiment of the present invention is etched using conventional methods to form silicon-starved nitride sidewall spacers 50.

Figure 6:
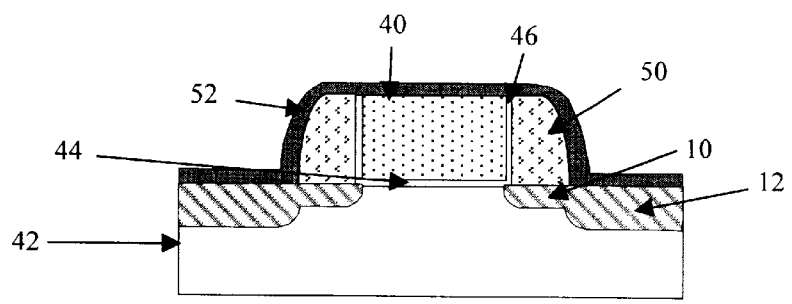

Turning to FIG. 6, a blanket layer of a refractory metal is deposited, as by sputtering or other method, on the gate electrode 40, the source/drain regions 12 and the silicon-starved silicon nitride sidewall spacers 50. The refractory metal can comprise cobalt (Co), titanium (Ti), tungsten (W), tantalum (Ta) or nickel (Ni).

Figure 7:
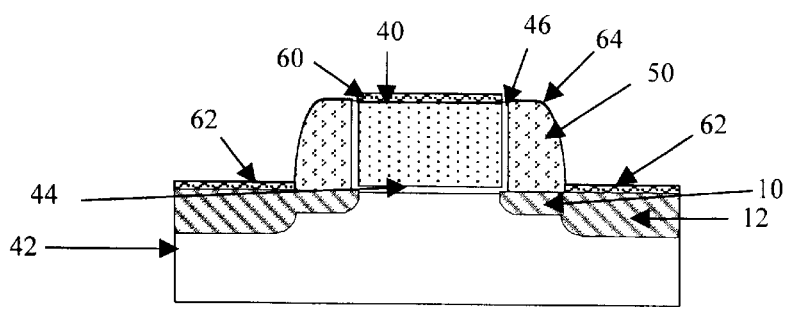

As illustrated in FIG. 7, once the refractory metal is deposited, heating is conducted, as by rapid thermal annealing, to react the refractory metal with the underlying Si to form a metal silicide layer 60 on the polysilicon gate electrode 40 and metal silicide layers 62 on the source/drain regions 12. When Ni is the refractory metal used, rapid thermal annealing, as at a temperature of approximately 300° C. to approximately 450° C., is conducted during which a low resistivity metal silicide layer 60, e.g., NiSi, is formed on gate electrode 40 while nickel silicide layers 62 are formed on source/drain regions 12 adjacent to the silicon-starved silicon nitride sidewall spacers 50. Additional annealing steps may be employed when using Co or Ti to form a metal silicide, e.g., $TiSi_2$ or $CoSi_2$.

Unreacted metal on the surfaces of the silicon-starved silicon nitride sidewall spacers 50 is then easily removed, as by wet chemical stripping. In an embodiment of the present invention, the unreacted refractory metal is removed by immersing the wafer into a solution of $H_2SO_4$, $H_2O_2$ and water (SPM) or a solution of $NH_4OH$, $H_2O_2$ and water (APM).

By forming silicon-starved silicon nitride sidewall spacers 50 having substantially no or significantly reduced free Si, reaction of the metal layer 52 with Si in the silicon-starved silicon nitride sidewall spacers 50 is effectively prevented. Accordingly, the inventive methodology avoids the formation of metal silicide on the silicon-starved silicon nitride sidewall spacers 50 and, hence, prevents bridging between the metal silicide layer 60 on the upper surface of gate electrode 40 and metal silicide layers 62 on the source/drain regions 12 adjacent to the silicon-starved silicon nitride sidewall spacers 50.

The present invention, therefore, enables the implementation of metal silicide methodology, advantageously utilizing silicon-starved silicon nitride sidewall spacers 50 without bridging between the metal silicide layer 60 formed on the upper surface of the gate electrode 40 and the metal silicide layers 62 formed on associated source/drain regions 12.

Another aspect of the present invention relates to a semiconductor device that includes a polysilicon gate electrode 40, source/drain regions 12, and silicon nitride sidewall spacers 50, wherein the silicon nitride sidewall spacers 50 are silicon-starved. Metal silicide layers 60 and 62 are formed by depositing a refractory metal, e.g., Co, Ti, Ta, Ni or W, on the wafer and heating to react the refractory metal with Si. Unreacted refractory metal is removed by wet chemical stripping.

The present invention enjoys industrial applicability in fabricating any of various types of semiconductor devices. The present invention has particular applicability in semiconductor devices with high circuit speeds having design features in the deep sub-micron regime.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein. Well-known processing structures have not been described in detail in order not to unnecessarily obscure the present invention.

What is claimed is:

1. A method of manufacturing a semiconductor device, the method comprising the steps of:

forming a silicon gate electrode, having an upper surface and side surfaces, overlying a silicon substrate with a gate dielectric layer therebetween, a spacer oxide liner disposed on the side surfaces, and source/drain regions in the substrate:

depositing a silicon nitride layer at:

a $SiH_4$ flow rate of approximately 100 sccm to approximately 250 sccm;

a $N_2$ flow rate of approximately 3,000 sccm to approximately 6,000 sccm;

a $NH_3$ flow rate of approximately 2,000 sccm to approximately 4,000 sccm;

a radio frequency power of approximately 200 watts to approximately 350 watts;

a pressure of approximately 1.6 torr to approximately 2.2 torr; and a temperature maintained at about 360° C. to approximately 380° C.;

anisotropically etching the silicon nitride layer to form silicon nitride sidewall spacers on the spacer oxide liner;

depositing a refractory metal layer;

heating to react the refractory metal with underlying Si to form a metal silicide layer on the gate electrode and a metal silicide layer on the source/drain regions; and removing unreacted refractory metal from the silicon nitride sidewall spacers.

2. The method of claim 1, comprising depositing the silicon nitride layer using plasma enhanced chemical vapor deposition (PECVD).

3. The method of claim 1, comprising supplying $SiH_4$ at a flow rate of approximately 150 sccm to approximately 200 sccm.

4. The method of claim 3, comprising supplying $SiH_4$ at a flow rate of approximately 175 sccm.

5. The method of claim 1, comprising supplying $N_2$ at a flow rate of approximately 4,000 sccm to approximately 5,000 sccm.

6. The method of claim 5, comprising supplying $N_2$ at a flow rate of approximately 4,500 sccm.

7. The method of claim 1, comprising supplying $NH_3$ at a flow rate of approximately 2,500 sccm to approximately 3,500 sccm.

8. The method of claim 7, comprising supplying $NH_3$ at a flow rate of approximately 3,000 sccm.

9. The method of claim 1, comprising depositing the silicon nitride layer at a radio frequency power of approximately 250 watts to approximately 300 watts.

10. The method of claim 9, comprising depositing the silicon nitride layer at a radio frequency power of approximately 275 watts.

11. The method of claim 1, comprising depositing the silicon nitride layer at a pressure of approximately 1.8 torr to approximately 2.0 torr.

12. The method of claim 11, comprising depositing the silicon nitride layer at a pressure of approximately 1.9 torr.

13. The method of claim 1, comprising depositing the silicon nitride layer at a temperature maintained at approximately 365° C. to approximately 375° C.

14. The method of claim 13, comprising depositing the silicon nitride layer at a temperature maintained at approximately 370° C.

15. The method of claim 1, wherein the refractory metal is selected from the group consisting of cobalt, titanium, tungsten, tantalum and nickel.

16. The method of claim 15, wherein the refractory metal comprises nickel.

17. The method of claim 1, wherein the metal silicide layer comprises NiSi.

18. The method of claim 1, comprising removing the unreacted refractory metal by wet chemical stripping.

19. The method of claim 18, comprising wet chemical stripping by immersing the substrate in a solution of $NH_4OH$, $H_2O_2$ and water (APM) or immersing the substrate in a solution of $H_2SO_4$, $H_2O_2$ and water (SPM).

* * * * *